United States Patent
Bedell et al.

(10) Patent No.: US 8,912,424 B2
(45) Date of Patent: Dec. 16, 2014

(54) MULTI-JUNCTION PHOTOVOLTAIC DEVICE AND FABRICATION METHOD

(75) Inventors: Stephen W. Bedell, Wappingers Falls, NY (US); Keith E. Fogel, Hopewell Junction, NY (US); Bahman Hekmatshoar-Tabari, Mount Kisco, NY (US); Devendra K. Sadana, Pleasantville, NY (US); Ghavam G. Shahidi, Round Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 13/612,632

(22) Filed: Sep. 12, 2012

(65) Prior Publication Data

US 2013/0025659 A1     Jan. 31, 2013

Related U.S. Application Data

(63) Continuation of application No. 13/193,871, filed on Jul. 29, 2011, now abandoned.

(51) Int. Cl.
*H01L 21/00*     (2006.01)
(52) U.S. Cl.
USPC ............................. 136/206; 438/73
(58) Field of Classification Search
USPC ................ 136/206, 243, 255, 258; 438/73
See application file for complete search history.

(56) References Cited

U.S. PATENT DOCUMENTS

| | | | |
|---|---|---|---|
| 2004/0065363 A1* | 4/2004 | Fetzer et al. | 136/262 |
| 2006/0180198 A1* | 8/2006 | Takamoto et al. | 136/255 |
| 2010/0047959 A1* | 2/2010 | Cornfeld et al. | 438/94 |
| 2010/0311250 A1 | 12/2010 | Bedell et al. | |
| 2013/0025654 A1* | 1/2013 | Bedell et al. | 136/255 |
| 2013/0025659 A1 | 1/2013 | Bedell et al. | |

OTHER PUBLICATIONS

U.S. Notice of Allowance dated Jun. 26, 2013 issued in parent U.S. Appl. No. 13/193,871.
Miles, R.W., "Inorganic photovoltaic cells", vol. 10, No. 11, pp. 20-27 Materials Today Nov. 2007.

* cited by examiner

*Primary Examiner* — Jack Chen
(74) *Attorney, Agent, or Firm* — Scully, Scott, Murphy & Presser, P.C.; Louis J. Percello, Esq.

(57) ABSTRACT

A method of forming a photovoltaic device that includes bonding a substrate to a germanium-containing semiconductor layer with a stressor layer, wherein the stressor layer cleaves the germanium-containing semiconductor layer. At least one semiconductor layer is formed on a cleaved surface of the germanium-containing semiconductor layer that is opposite the conductivity type of the germanium-containing semiconductor layer to provide a first solar cell. The first solar cell absorbs a first range of wavelengths. At least one second solar cell may be formed on the first solar cell, wherein the at least one second solar cell is composed of at least one semiconductor material to absorb a second range of wavelengths that is different than the first range wavelengths absorbed by the first solar cell.

12 Claims, 7 Drawing Sheets

MULTI-JUNCTION PHOTOVOLTAIC DEVICE AND FABRICATION METHOD

CROSS REFERENCE TO RELATED APPLICATION

This application is a continuation of U.S. patent application Ser. No. 13/193,871, filed Jul. 29, 2011, the entire content and disclosure of which is incorporated herein by reference.

BACKGROUND

The present disclosure relates to photovoltaic devices, and more particularly to photovoltaic devices such as, for example, solar cells.

A photovoltaic device is a device that converts the energy of incident photons to electromotive force (e.m.f.). Typical photovoltaic devices include solar cells, which are configured to convert the energy in the electromagnetic radiation from the Sun to electric energy. Multi-junction solar cells of different semiconductor compositions may be employed for power generation in space due to their high efficiency and radiation stability. Multi-junction solar cells are mainly fabricated on germanium (Ge) substrates due to the inherently strong (IR) absorption property of germanium (Ge). Germanium (Ge) also includes a crystal structure that can be lattice matched to III-V materials, which allows for integration of III-V sub cells on a germanium (Ge) substrate. The germanium (Ge) substrate may constitute nearly 50% to 70% of the final cost of the finished solar cell.

BRIEF SUMMARY

A method of forming a photovoltaic device is provided that includes at least two solar cells. In one embodiment, the method of forming the photovoltaic device includes joining a flexible substrate to a germanium containing semiconductor layer with a stressor layer, wherein the stressor layer cleaves the germanium containing semiconductor layer. At least one semiconductor layer is formed on the cleaved surface of the germanium-containing semiconductor layer, wherein at least one semiconductor layer has a conductivity type that is opposite the conductivity type of the germanium-containing semiconductor layer to provide a first solar cell. The first solar cell absorbs a first range of wavelengths. At least one second solar cell may then be formed on the first solar cell, wherein the at least one second solar cell is composed of at least one semiconductor material to absorb a second range of wavelengths that is different than the first range of wavelengths absorbed by the first solar cell.

In another aspect, the present disclosure provides a photovoltaic cell that is composed of at least two solar cells. In one embodiment, the photovoltaic device includes a flexible substrate, and a back contact structure on an upper surface of the flexible substrate. A first solar cell may be present on the back contact structure, wherein the first solar cell includes a germanium-containing crystalline semiconductor layer having a thickness ranging from 100 nm to 10 µm. The first solar cell absorbs a first range of wavelengths. At least a second solar cell may be present on the first solar cell. The second solar cell may be composed of at least one amorphous or crystalline semiconductor material that is selected so that the second solar cell absorbs a second range of wavelengths that is different than the first set of wavelengths absorbed by the first solar sell. A front contact structure may be present on the upper surface of the second solar cell.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
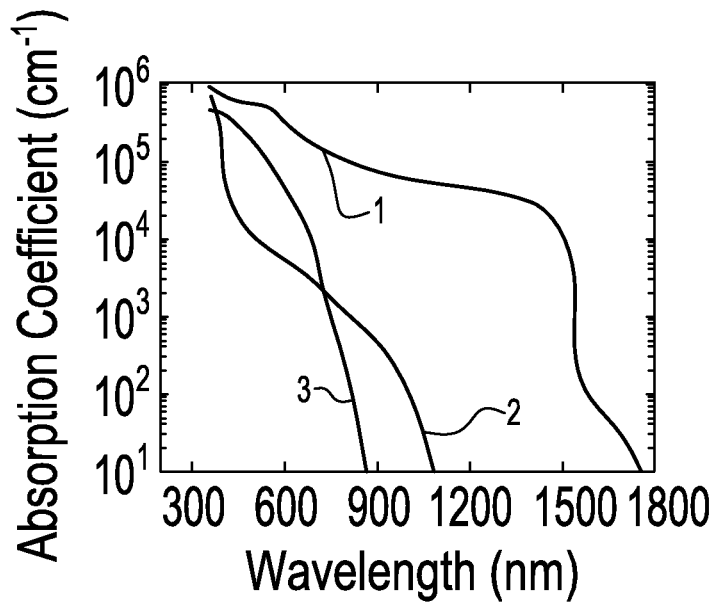
FIG. 1 is a plot of wavelength (nm) vs. absorption coefficient ($cm^{-1}$) for crystalline germanium (c-Ge), crystalline silicon (c-Si), and hydrogenated amorphous silicon (a-Si:H), in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures, as they are oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides a multi-junction photovoltaic device, and a fabrication method for forming a multi-junction solar cell, in which the methods and structures include a semiconductor-containing layer, e.g., germanium layer, that is formed using a layer transfer method, such as spalling. As used herein, a "photovoltaic device" is a device, such as a solar cell, that produces free electrons and/or vacancies, i.e., holes, when exposed to radiation, such as light, and results in the production of an electric current. The photovoltaic device typically includes layers of p-type conductivity and n-type conductivity that share an interface to provide a junction.

In some embodiments, the disclosed multi-junction photovoltaic device is composed of a single-junction or multi-junction amorphous, nano-crystalline, micro-crystalline and/or poly-crystalline top cell, grown on a bottom cell including a germanium-containing layer that has been transferred using a layer transfer method, e.g., spalling, and/or fabricated after layer transfer onto a flexible substrate. In some embodiments, the spalling method disclosed herein makes it possible to use a thin layer of semiconductor, e.g., germanium layer, as the substrate, lowering the substrate cost, as well as allowing the photovoltaic device to be mechanically flexible. The term "flexible" when referring to a photovoltaic device means that the photovoltaic device remains operational under an inward or outward curvature with a radius of at least 30 cm.

Referring to FIG. 1, germanium is typically used for the bottom cell of multi-junction photovoltaic devices due to germanium's low bandgap. FIG. 1 depicts the higher absorption coefficient of single crystalline germanium, as indicated by plot line 1, in comparison to single crystal silicon, as indicated by plot line 2, and hydrogenated amorphous silicon, as indicated by plot line 3. In comparison to single crystal silicon, single crystalline germanium is an expensive material. Therefore, the disclosed spalling method, which may provide for the transfer of thin germanium layers, may reduce the cost of photovoltaic device manufacturing including germanium containing material layers. Furthermore, in some embodiments, the thickness of the semiconductor-containing layer, e.g., germanium layer, being transferred by the disclosed spalling process provides that the photovoltaic cell including the transferred semiconductor-containing layer, e.g., germanium layer, is flexible. For example, the spalling method disclosed herein provides for the transfer of a semiconductor-containing layer, e.g., germanium layer, having a thickness ranging from 100 nm to 10 microns, hence providing a transferred semiconductor-containing layer, e.g., germanium layer, that is flexible.

Figure 2:
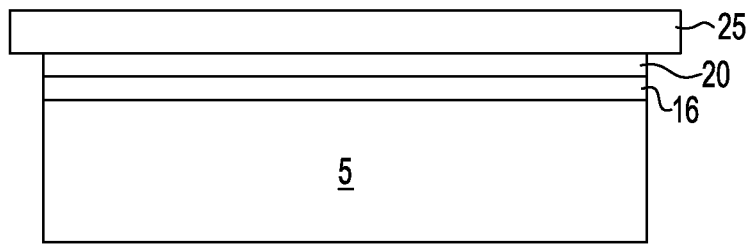
FIGS. 2 and 3 are side cross-sectional views depicting a method of forming a photovoltaic device that includes joining a flexible substrate to a germanium-containing semiconductor layer using a stressor layer, wherein the stressor layer cleaves the germanium containing semiconductor layer, in accordance with one embodiment of the present disclosure.
Figure 3:
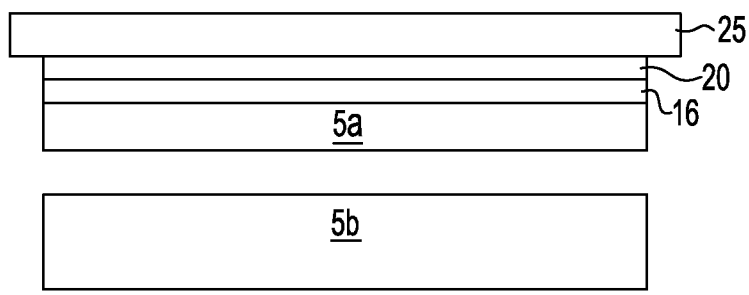

FIGS. 2 and 3 depict one embodiment of a method of transferring a semiconductor-containing layer 5a, e.g., germanium layer, for use in a photovoltaic device. Although the following description refers to the transferred portion of the semiconductor-containing layer 5a as a "germanium-containing layer", such as a single crystal germanium (c-Ge) layer, it is noted that the present disclosure is equally applicable to the other semiconductor materials that are suitable for the bottom cell of a multi-junction photovoltaic device. For example, the transferred portion of the semiconductor-containing layer 5a may also be composed of a low bandgap material, such as InSb, InAs, InGaAs, InGaSb and InN, as well as materials with higher bandgaps, such as Si or GaAs.

FIG. 2 depicts forming a stressor layer 20 to a germanium-containing substrate 5. In one embodiment, the method may include bonding a flexible substrate 25 to a germanium-containing substrate 5 using a stressor layer 20 and an optional metal adhesion layer 16, wherein in a subsequent process step the stress produced by the stressor layer 20 is transmitted to the germanium-containing substrate 5 to cleave the germanium-containing substrate 5.

In one embodiment, the germanium-containing substrate 5 may have a germanium content that is greater than 50 at. %. In another embodiment, the germanium-containing substrate 5 may have a germanium content that is greater than 99 at. %. In one example, the germanium-containing substrate 5 may have a germanium content that is 100 at. %. The germanium-containing substrate 5 may be formed using a single crystal (monocrystalline) method. One example of a single crystal method for forming the germanium-containing substrate 5 is the Czochralsky (CZ) method. The Czochralsky (CZ) method includes taking a seed of single-crystal germanium and placing it in contact with the top surface of molten germanium. As the seed is slowly raised (or pulled), atoms of the molten germanium solidify in the pattern of the seed and extend the single-crystal structure. The single-crystal structure is then sawn into wafers, i.e., substrates, that can provide the germanium-containing substrate 5. As indicated above, although the substrate is described as being composed of germanium, other materials may also be employed for the substrate. For example, the substrate may be composed of a low bandgap material, such as InSb, InAs, InGaAs, InGaSb and InN, as well as materials with higher bandgaps, such as Si or GaAs.

The germanium-containing substrate 5 may be doped to an n-type or p-type conductivity or may be an intrinsic semiconductor layer. As used herein, "p-type" refers to the addition of impurities to an intrinsic semiconductor that creates deficiencies of valence electrons (i.e. holes). As used herein, "n-type" refers to the addition of impurities that contributes free electrons to an intrinsic semiconductor. The dopant that provides the conductivity type of the germanium-containing substrate may be introduced by an in-situ doping process. The term "conductivity type" denotes a p-type or n-type dopant. By "in-situ" it is meant that the dopant that provides the conductivity type of the material layer is introduced as the material layer is being formed or deposited. The p-type and/or n-type dopant for the germanium-containing substrate 5 may also be introduced following the deposition of the germanium-containing substrate 5 using at least one of plasma doping, ion implantation, and/or outdiffusion from a disposable diffusion source (e.g., borosilicate glass).

When employed in the lower cell of a photovoltaic device and doped to a p-type conductivity, the concentration of the p-type dopant in the germanium-containing substrate 5 ranges from $10^{14}$ atoms/cm$^3$ to $10^{18}$ atoms/cm$^3$. When employed in the lower cell of a photovoltaic device and doped to an n-type conductivity, the concentration of the n-type dopant in the germanium-containing substrate 5 ranges from $10^{14}$ atoms/cm$^3$ to $10^{18}$ atoms/cm$^3$.

In one embodiment, the thickness of the germanium-containing substrate 5 prior to spalling may range from 10 μm to 1 mm. In another embodiment, the thickness of the germanium-containing substrate 5 prior to spalling may range from 150 μm to 700 μm. It is noted that the above thicknesses for the germanium-containing substrate 5 have been provided for illustrative purposes only, and are not intended to limit the present disclosure. For example, other thicknesses of the germanium-containing substrate 5 may be employed, so long as the thickness of the germanium-containing substrate 5 provides that at least a residual portion of the germanium-containing substrate 5 remains connected to the handling substrate 25 through at least the stressor layer 20.

FIG. 2 depicts one embodiment of bonding a stressor layer 20 to a bonding surface that is present on the germanium-containing substrate 5. The bonding surface that is present on the germanium-containing substrate 5 may be a surface of the germanium-containing substrate 5, or may be the surface of a material layer that is formed on the surface of the germanium-containing substrate 5. In one embodiment, the material layer that is formed on the germanium-containing substrate 5 that provides the bonding surface of the germanium-containing substrate 5 may be at least one of a back surface field layer, a back surface passivation layer, a localized back surface field region, or a combination thereof.

In one embodiment, a back surface field region (not shown) may be formed on a surface of the germanium-containing substrate 5 that is connected to the stressor layer 20. A "back surface field (BSF) region" is a doped region having a higher dopant concentration than the germanium-containing substrate 5 and/or a lower electron affinity ($\chi_e$) than the germanium-containing substrate 5 (in case of n-type doping), and/or a larger sum of electron affinity and bandgap ($E_g$), i.e. $\chi_e + E_g$ than the germanium containing substrate 5 (in case of p-type doping). The back surface field region and the germanium-containing substrate 5 typically have the same conductivity type, e.g., p-type or n-type conductivity. The junction between the back surface field (BSF) region and the germanium-containing substrate 5 creates an electric field which introduces a barrier to minority carrier flow to the rear surface. The back surface field (BSF) region therefore reduces the rate of carrier recombination at the rear surface, and as such has a net effect of passivating the rear surface of the solar cell. A "localized back surface region" is similar to a back surface field region with the exception that a back surface field region is typically a continuous region that extends across the entire width of the germanium-containing substrate 5, whereas a "localized back surface field region" is present in discontinuous islands along the width of the germanium-containing substrate 5.

In one embodiment, a passivation layer (not shown) may be present between the back surface field region of the germanium-containing substrate 5 and the stressor layer 20. The passivation layer is a material layer that is formed on the back surface of the germanium-containing substrate 5, which provides the lower cell of the subsequently formed photovoltaic cell, wherein the passivation layer reduces the concentration of dangling bonds at the back surface of the bottom cell of the photovoltaic device, and therefore reduces the rate of carrier recombination at the back surface. In one embodiment, the passivation layer is composed of a hydrogenated amorphous silicon and/or germanium containing material is selected from the group consisting of hydrogenated amorphous silicon (a-Si:H), hydrogenated amorphous germanium (a-Ge:H), hydrogenated amorphous silicon germanium (a-SiGe:H) and a combination thereof. The passivation layer may contain carbon, nitrogen, oxygen, fluorine or deuterium. Typically, the passivation layer is an intrinsic semiconductor layer. Deposition of the hydrogenated amorphous silicon and/or germanium containing material by PECVD includes at least one semiconductor material containing reactant gas and at least one hydrogen containing reactant gas. In one embodiment, the semiconductor material containing reactant gas for producing the hydrogenated amorphous silicon containing material includes at least one atom of silicon. For example, to provide the silicon component of the hydrogenated amorphous silicon, the semiconductor material containing reactant gas can include at least one of $SiH_4$, $Si_2H_6$, $SiH_2Cl_2$, $SiHCl_3$, and $SiCl_4$. For example, the germanium component may be provided by $GeH_4$. The hydrogen containing reactant gas for depositing the hydrogenated amorphous silicon containing material by PECVD may be hydrogen gas ($H_2$).

Still referring to FIG. 2, a stressor layer 20 may be formed on the germanium containing substrate 5 or may be formed on a material layer, such as a passivation layer, that is present on the germanium-containing substrate 5. In one embodiment, the stressor layer 20 is composed of a metal containing layer, a polymer layer, an adhesive tape or a combination thereof. In some embodiments of the present disclosure, the surface that the stressor layer 20 is formed on can be cleaned prior to remove surface oxides and/or other contaminants therefrom. In one embodiment, the surface that the stressor layer 20 is formed on may be cleaned by applying a solvent, such as, e.g., acetone and isopropanol, which is capable of removing contaminates and/or surface oxides from the bonding surface of the germanium-containing substrate 5.

In some embodiments, an optional metal-containing adhesion layer 16 is formed on the bonding surface of the germanium-containing substrate 5. The optional metal-containing adhesion layer 16 is employed in embodiments in which the stressor layer 20 to be subsequently formed has poor adhesion to bonding surface of the germanium-containing substrate 5.

Typically, the metal-containing adhesion layer 16 is employed when a stressor layer 20 comprised of a metal is employed.

The optional metal-containing adhesion layer 16 employed in the present disclosure includes any metal adhesion material such as, but not limited to, Ti/W, Ti, Cr, Ni or any combination thereof. The optional metal-containing adhesion layer 16 may comprise a single layer or it may include a multilayered structure comprising at least two layers of different metal adhesion materials.

The metal-containing adhesion layer 16 may be formed at room temperature (15° C.-40° C.) or above. In one embodiment, the optional metal-containing adhesion layer 16 is formed at a temperature ranging from 20° C. to 180° C. In another embodiment, the optional metal-containing adhesion layer 16 is formed at a temperature that ranges from 20° C. to 60° C.

The metal-containing adhesion layer 16, which may be optionally employed, can be formed utilizing deposition techniques that are well known to those skilled in the art. For example, the optional metal-containing adhesion layer 16 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 16 typically has a thickness of from 5 nm to 200 nm, with a thickness of from 100 nm to 150 nm being more typical. Other thicknesses for the optional metal-containing adhesion layer 16 that are below and/or above the aforementioned thickness ranges can also be employed in the present disclosure.

In some embodiment, the stressor layer 20 is formed on an exposed surface of the optional metal-containing adhesion layer 16. In some embodiments in which the optional metal-containing adhesion layer 16 is not present, the stressor layer 20 is formed directly on the germanium containing substrate; this particular embodiment is not shown in the drawings, but can readily be deduced from the drawings illustrated in the present application.

The stressor layer 20 that is employed in the present disclosure includes any material that is under tensile stress on base substrate, e.g., germanium-containing substrate 5, at the spalling temperature. Illustrative examples of such materials that are under tensile stress when applied atop the germanium-containing substrate 5 include, but are not limited to, a metal, a polymer, such as a spall inducing tape layer, or any combination thereof. The stressor layer 20 that may comprise a single stressor layer, or a multilayered stressor structure including at least two layers of different stressor material can be employed.

In one embodiment, the stressor layer 20 is a metal, and the metal is formed on an upper surface of the optional metal-containing adhesion layer 16. In another embodiment, the stressor layer 20 is a spall inducing tape, and the spall inducing tape is applied directly to the bonding surface of the germanium-containing substrate 5. In another embodiment, for example, the stressor layer 20 may comprise a two-part stressor layer including a lower part and an upper part. The upper part of the two-part stressor layer can be comprised of a spall inducing tape layer.

When a metal is employed as the stressor layer 20, the metal can include, for example, Ni, Cr, Fe or W. Alloys of these metals can also be employed. In one embodiment, the stressor layer 20 includes at least one layer consisting of Ni.

When a polymer is employed as the stressor layer 20, the polymer is a large macromolecule composed of repeating structural units. These subunits are typically connected by covalent chemical bonds. Illustrative examples of polymers that can be employed as the stressor layer 20 include, but are not limited to, polyimides polyesters, polyolefins, polyacrylates, polyurethane, polyvinyl acetate, and polyvinyl chloride.

When a spall inducing tape layer is employed as the stressor layer 20, the spall inducing tape layer includes any pressure sensitive tape that is flexible, soft, and stress free at the first temperature used to form the tape, yet strong, ductile and tensile at the second temperature used during removal of the upper portion of the base substrate. By "pressure sensitive tape," it is meant an adhesive tape that will stick with application of pressure, without the need for solvent, heat, or water for activation. Tensile stress in the tape is primarily due to thermal expansion mismatch between the germanium-containing substrate 5 (with a lower thermal coefficient of expansion) and the tape (with a higher thermal expansion coefficient).

Typically, the pressure sensitive tape that is employed in the present disclosure as the stressor layer 20 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 20 that is employed in the present disclosure is formed at room temperature (15° C.-40° C.). In another embodiment, when a tape layer is employed, the tape layer can be formed at temperature ranging from 15° C. to 60° C.

When the stressor layer 20 is a metal or polymer, the stressor layer 20 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 20 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer 20 include, for example, Nitto Denko 3193MS thermal release tape, Kapton KPT-1, and Diversified Biotech's CLEAR-170 (acrylic adhesive, vinyl base).

In one embodiment, a two-part stressor layer 20 can be formed on a bonding surface of the germanium containing substrate 5, wherein a lower part of the two-part stressor layer 20 is formed at a first temperature, which is at room temperature or slight above (e.g., from 15° C. to 60° C.), wherein an upper part of the two-part stressor layer 20 comprises a spall inducing tape layer at an auxiliary temperature which is at room temperature. In this embodiment, the germanium-containing substrate 5 including the two-part stressor layer is brought to a second temperature that is less than room temperature to initiate spalling.

If the stressor layer 20 is of a metallic nature, it typically has a thickness of from 3 µm to 50 µm, with a thickness of from 4 µm to 7 µm being more typical. Other thicknesses for the stressor layer 20 that are below and/or above the aforementioned thickness ranges can also be employed in the present disclosure.

If the stressor layer 20 is of a polymeric nature, it typically has a thickness of from 10 µm to 200 µm, with a thickness of from 50 µm to 100 µm being more typical. Other thicknesses for the stressor layer 20 that are below and/or above the aforementioned thickness ranges can also be employed in the present disclosure. In the following description, the stressor layer 20 is described as being composed of a metallic, and may also provide the back contact of the photovoltaic device. As indicated above, the stressor layer 20 is not limited to a metallic structure. In these embodiments, a back contact structure may be formed after spalling.

In one embodiment, a handling substrate 25 can be formed atop the stressor layer 20. The handling substrate 25 employed in the present disclosure may comprise any flexible material that has a minimum radius of curvature of less than 30 cm. Illustrative examples of flexible materials that can be employed as the handling substrate 25 include a metal foil, a polyimide foil, or a thin flexible sheet of glass. The handling substrate 25 can be used to provide better fracture control and more versatility handling the spalled portion of the germanium-containing substrate 5. Moreover, the handling substrate 25 can be used to guide the crack propagation during the spontaneous spalling process of the present disclosure. The handling substrate 25 of the present disclosure is typically, but not necessarily, formed at room temperature (15° C.-40° C.). The handling substrate 25 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. The handling substrate 25 typical has a thickness of from 1 µm to few mm, with a thickness of from 70 µm to 120 µm being more typical. Other thicknesses for the handling substrate 25 that are below and/or above the aforementioned thickness ranges can also be employed in the present disclosure. It is noted that the handling substrate 35 may also be composed of a rigid material.

FIG. 3 depicts one embodiment of cleaving the germanium-containing substrate, wherein a transferred portion of the germanium-containing substrate 5a remains connected to the stressor layer 20 and the handling substrate 25. By "cleaving" it is meant that a transferred portion of the germanium-containing substrate 5a that is connected to the stressor layer 20 and the handling substrate 25 is separated from a separated portion of the germanium-containing substrate 5b that is not connected to the stressor layer 20 and the handling substrate 25, so that the transferred portion of the germanium-containing substrate 5a has a thickness T1 that is less than the original thickness of the germanium-containing substrate.

FIG. 3 depicts one embodiment, of applying a stress from the stressor layer 20 to the germanium-containing substrate, in which the stress cleaves the germanium-containing substrate to provide a cleaved surface 4 on the transferred portion of the germanium-containing substrate 5a. The condition that results in spalling of the germanium-containing substrate may be related to the combination of the stressor layer 20 thickness value and the stress value for the stressor layer 20, as well as the mechanical properties of the germanium-containing substrate. At a given stressor layer 20 thickness value, there will be a stress value above which spalling will occur spontaneously. Likewise, at a given stressor layer 20 stress value, there will be a thickness value above which spalling will occur spontaneously.

An approximate guide for the stressor layer 20 thickness value at which spalling becomes possible for the case where the stressor layer 20 is substantially comprised of tensile stressed Ni is given by the relation $t^* = [(2.5 \times 10^6)(K_{IC}^{3/2})]/\sigma^2$, where $t^*$ is the thickness value (in units of microns) of the stressor layer 20 at which controlled spalling becomes possible, $K_{IC}$ is the fracture toughness value of the germanium-containing substrate (in units of $MPa*m^{1/2}$), e.g., fracture toughness value of the germanium-containing substrate, and $\sigma$ is the magnitude of the stress value in the stressor layer 20 (in units of MPa, or megapascals). If the stressor layer 20 thickness is greater than the value given by $t^*$ by approximately 50%, then spontaneous spalling may occur. In another aspect, the thickness of the stressor layer 20 may be anywhere from about 1 um to about 50 um, or from about 3 um to about 30 um, or about 4 um to about 20 um thick.

Selection of the stressor layer 20 does not have to be based on the difference between the coefficient of thermal expansion of the stressor layer 20 and the coefficient of thermal expansion of the germanium-containing substrate for promoting spontaneous spalling as in the prior art, where spalling is effected by cooling the structure from an elevated temperature (about 900° C.) to a lower temperature. In one embodiment, the present disclosure does not rely on spontaneous spalling, but rather the use of mechanical force, and controlled fracture at substantially room temperature (about 20° C.) to separate layers or layers from the germanium-containing substrate 5, e.g., separate a transferred portion of the germanium-containing substrate 5a from a separated portion of the germanium-containing substrate 5b that is not connected to the stressor layer 20 and the handling substrate 25. The thickness of the transferred portion of the germanium-containing substrate 5a that is attached to the stressor layer 20 from the germanium-containing substrate is roughly twice the thickness value of stressor layer 20. By controlling the amount of stress in the stressor layer 20, the operable thickness value of the stressor layer 20 ($t^*$) can be chosen to remove a controlled thickness of the transferred portion of the germanium-containing substrate 5a.

Although the origin of the stress in the stressor layer 20 is intrinsic (originating from microstructure), and not due to coefficient of thermal expansion (CTE) stress, heating the stressor layer 20 often has the effect of increasing the stress value. This is due to microstructural changes within the stressor layer 20 that occur upon annealing and is irreversible. Localized heating is therefore contemplated to initiate fracture in the periphery of the area to be layer transferred. In other words, spontaneous spalling can be made to occur in small, selected regions to help initiate fracture, e.g., by increasing the thickness of the stress layer in these small selected regions. Localized heating can be performed using a laser, remote induction heating, or direct contact heating.

The transferred portion of the germanium-containing substrate 5a having the cleaved surface 4 that is formed by the spontaneous spalling process mentioned above typically has a thickness T1 of from 100 nm to tens of µm, with a thickness T1 of from 3 µm to 20 µm being more typical. The above-mentioned thicknesses for the transferred portion of the germanium-containing substrate 5a provide a flexible material layer.

FIGS. 4-8 depict some embodiments of forming the bottom solar cell 50a, 50b, 50c, 50d, 50e of a multi-junction photovoltaic device that includes forming at least one semiconductor layer 6 on the cleaved surface 4 of the transferred portion of the germanium-containing substrate 5a. In each of the embodiments depicted in FIGS. 4-8, the layers/regions below the cleaved surface 4, as orientated in the figures, are formed before spalling, interchangeably referred to as cleaving, and the layers/regions above the cleaved are formed after spalling. The cleaved surface and/or the bottom surface of the bottom cell, e.g., transferred portion of the germanium-containing substrate 5a, of the photovoltaic device may or may not be textured. The texturing may be done by selective and/or random wet and/or dry etching.

Figure 4:
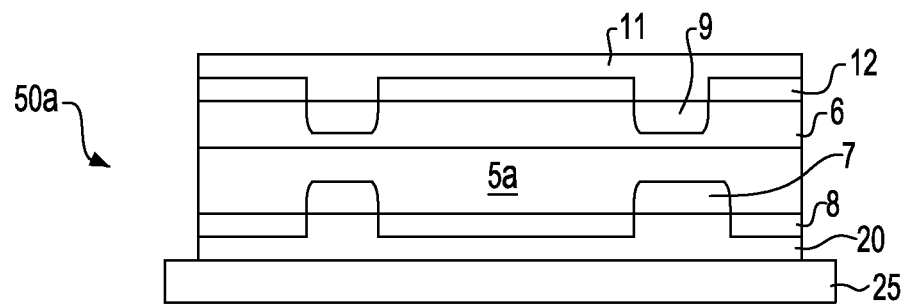
FIGS. 4-8 are side cross-sectional views depicting some embodiments of forming the bottom solar cell of a multi-junction photovoltaic device that includes forming at least one semiconductor layer on a cleaved surface of the germanium-containing semiconductor layer, in accordance with the present disclosure.

FIG. 4 depicts one embodiment of a bottom solar cell 50a of a multi-junction photovoltaic device in which the layers/regions formed prior to cleaving of the germanium-containing substrate include a passivation layer 8 and a localized back surface field region 7. The passivation layer 8 may be composed of hydrogenated amorphous silicon and is typically an intrinsic semiconductor material. The passivation layer 8 may be formed in direct contact with the surface of the transferred portion 5a of the germanium-containing substrate that is opposite the cleaved surface 4 of the germanium-containing substrate. One embodiment of a method for forming the passivation layer 8 that is depicted in FIG. 4 has been described above with reference to FIG. 2. In another embodiment, the passivation layer 8 may be composed of a dielectric, such as an oxide, e.g., silicon oxide, or a nitride, e.g., silicon nitride. Typically, following formation, the passivation layer 8 is patterned and etched to provide openings there through to expose the portions of the transferred portion of the germanium-containing substrate 5a in which the localized back surface field region 7 is formed. The localized back surface region 7 may be formed through the openings in the passivation layer 8 using at least one of plasma doping, ion implantation, and/or outdiffusion from a disposable diffusion source (e.g., borosilicate glass). The localized back surface field region 7 is typically doped to the same conductivity type as the transferred portion of the germanium-containing substrate 5a, but the concentration of the dopant that provides the conductivity type in the localized back surface field region 7 is greater than the concentration of the dopant that provides the conductivity type in the transferred portion of the germanium-containing substrate 5a.

Still referring to FIG. 4, in some embodiments, the bottom solar cell 50a of a multi-junction photovoltaic device further includes a transparent conductive oxide material (not shown). In one embodiment, the transparent conductive material layer can include a transparent conductive oxide (TCO) such as, but not limited to, a fluorine-doped tin oxide ($SnO_2$:F), an aluminum-doped zinc oxide (ZnO:Al), tin oxide (SnO) and indium tin oxide ($InSnO_2$, or ITO for short). The thickness of the transparent conductive material layer may vary depending on the type of transparent conductive material employed, as well as the technique that was used in forming the transparent conductive material. Typically, and in one embodiment, the thickness of the transparent conductive material layer ranges from 10 nm to 3 microns. In some embodiments, in which the stressor layer 20 and/or optional metal-containing adhesion layer (not depicted in FIG. 4) is a conductive element, the stressor layer 20 may function as the back contact of the bottom solar cell 50a. The handling substrate 25, which may be flexible, may be present at the back surface of the bottom solar cell 50a.

A semiconductor layer 6 may be epitaxially grown on the cleaved surface 4 of the transferred portion of the germanium-containing substrate 5a. In the embodiment that is depicted in FIG. 4, the transferred portion 5a of the germanium-containing substrate may function as the absorption layer of the solar cell, and the semiconductor layer 6 may function as the emitter layer of the solar cell. The semiconductor layer 6 is hereafter referred to as a "first emitter region 6" when describing the structure depicted in FIG. 4. The "absorption layer" is the material that readily absorbs photons to generate charge carriers, i.e., free electrons or holes. A portion of the photovoltaic device, between the front side and the absorption layer is referred to as the "emitter layer", and the junction with the absorption layer is referred to as the "emitter junction". The emitter layer may be present atop the absorption layer, in which the emitter layer has a conductivity type that is opposite the conductivity type of the absorption layer. In one example, when the Sun's energy in the form of photons collects in the cell layers, electron-hole pairs are generated in the material within the photovoltaic device. The emitter junction provides the required electric field for the separation of the photo-generated electrons and holes on the n-doped and p-doped sides of the emitter junction, respectively. For this reason, and in this example, at least one p-type layer of the photovoltaic device may provide the absorption layer, and at least one adjacent n-type layer may provide the emitter layer.

In the embodiment depicted in FIG. 4, the bottom solar cell 50a includes a double emitter structure composed of a first emitter region 6 and a second emitter region 9. Typically, in a double emitter structure the first and second emitter regions 6, 9 have the same conductivity type, e.g., n-type or p-type conductivity. The concentration of dopant that provides the conductivity of the first emitter region 6 and the second emitter region 9 it typically greater in the second conductivity region 9. In one embodiment, the first emitter region 6 and the second emitter region 9 having a p-type conductivity type are formed on an n-type conductivity single crystalline germanium (c-Si) absorption layer, e.g., transferred portion of the germanium-containing substrate 5a. In another embodiment, the first emitter region 6 and the second emitter region 9 having an n-type conductivity type are formed on a p-type conductivity single crystalline germanium (c-Si) absorption layer, e.g., transferred portion of the germanium-containing substrate 5a.

The first emitter region 6 may be an amorphous material, a nanocrystalline material, a microcrystalline material, a polycrystalline material, or a single crystalline material of silicon, germanium, or silicon-germanium alloys that may or may not include hydrogen. The term "crystalline" includes nanocrystalline, polycrystalline or microcrystalline. The term "single crystalline" denotes a crystalline solid, in which the crystal lattice of the entire sample is substantially continuous and substantially unbroken to the edges of the sample, with substantially no grain boundaries. In another embodiment, the crystalline semiconductor material of the absorption layer is of a multi-crystalline or polycrystalline structure. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns).

Still referring to FIG. 4, the first emitter region 6 may be a material layer that is present on, and in direct contact with, the entire width of the absorption layer, i.e., transferred portion of the germanium-containing substrate 5a. In one embodiment, the first emitter region 6 is a continuous layer that is present across the entire width of the absorption layer, and the second emitter region 9 is composed of islands of discontinuous material that are positioned to be contacted by the subsequently formed tunneling layer 11.

In some embodiments, the first emitter region 6 may be composed of a crystalline semiconductor layer may be composed of a silicon-containing material or a germanium-containing material. Some examples of materials suitable for the first emitter region 6 include silicon, germanium, silicon germanium, silicon alloyed with carbon, silicon germanium alloyed with carbon and combinations thereof. The first emitter region 6 may also be a compound semiconductor, such as type III-IV semiconductors. A "III-V semiconductor material" is an alloy composed of elements from group III and group V of the Periodic Table of Elements. In one embodiment, the first emitter region 6 is comprised of at least one III-V semiconductor material selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. The first emitter region 6 may further include fluorine, deuterium, oxygen and/or nitrogen.

The first emitter region 6 may be formed on the transferred portion of the germanium-containing substrate 5a using chemical vapor deposition (CVD). CVD is a deposition process in which a deposited species is formed as a result of chemical reaction between gaseous reactants, wherein the solid product of the reaction is deposited on the surface on which a film, coating, or layer of the solid product is to be formed. Variations of CVD processes suitable include, but are not limited to, Atmospheric Pressure CVD (APCVD), Low Pressure CVD (LPCVD) and Plasma Enhanced CVD (PECVD), Metal-Organic CVD (MOCVD), molecular beam epitaxy (MBE) and combinations thereof.

In one embodiment, the first emitter region 6 is formed using an epitaxial deposition process. The terms "epitaxially formed", "epitaxial growth" and/or "epitaxial deposition" means the growth of a semiconductor material on a deposition surface of a semiconductor material, in which the semiconductor material being grown has the same crystalline characteristics as the semiconductor material of the deposition surface. Therefore, in the embodiments in which the transferred portion of the germanium-containing substrate 5a that provides the bottom cell of bottom solar cell 50a has a single crystal crystalline structure, the epitaxially grown first emitter region 6 also has a single crystal crystalline structure. Further, in the embodiments in which the transferred portion of the germanium-containing substrate 5a has a polycrystalline structure, a first emitter region 6 that is epitaxially grown on the transferred portion 5a of the germanium-containing substrate will also have a polycrystalline structure.

The first emitter region 6 may be doped with an in-situ doping process or may be doped following deposition of the material layer for the first emitter region using at least one of plasma doping, ion implantation, and/or outdiffusion from a disposable diffusion source (e.g., borosilicate glass). By in-situ it is meant that the dopant that provides the conductivity type of the material layer, e.g., first emitter region 6, is introduced as the material layer is being formed or deposited.

Still referring to FIG. 4, an upper dielectric layer 12 may be present on the upper surface of the first emitter region 6, in which openings are formed through the upper dielectric layer 12 to expose the portion of the first emitter region 6 in which the second emitter region 9 is formed. The upper dielectric layer 12 may be composed of silicon oxide, silicon nitride or a combination thereof. In another embodiment, the upper dielectric layer 12 may be composed of intrinsic hydrogenated amorphous silicon, hydrogenated amorphous germanium, hydrogenated amorphous silicon germanium or a combination thereof. The openings that are formed through the upper dielectric layer 12 that correspond to the second emitter region 9 of the emitter structure are formed using photolithography and etch processes. Once the portion of the first emitter region 6 is exposed, in which the second emitter region 9 is to be positioned, the exposed portions of the first emitter region 6 are implanted with the dopant that provides the second emitter region 9 using at least one of plasma doping, ion implantation, and/or outdiffusion from a disposable diffusion source (e.g., borosilicate glass). The dopant for the second emitter region 9 is typically the same conductivity as the first emitter region 6, and the dopant concentration in the second emitter region 9 is typically greater than the dopant concentration of the first emitter region 6.

In another embodiment that is not depicted in FIG. 4, instead of the first emitter region being provided by a deposited material layer, such as an epitaxially formed semiconductor layer, the first emitter region may be formed in the transferred portion of the germanium-containing substrate by counter doping the cleaved surface of the transferred portion of the germanium-containing substrate. By "counter doping" it is meant that the dopant that provides the first emitter region has an opposite conductivity type than the conductivity type of the transferred portion of the germanium containing substrate that provides the absorption layer. The second emitter region may be formed in the counter doped first emitter region using the method for forming the second emitter region that is described above with reference to FIG. 4.

Referring to FIG. 4, in one embodiment, a tunneling layer 11 is formed on the upper dielectric layer 12, and includes a portion that is in direct contact with the second emitter region 9. The tunneling layer 11 may be composed of a metal layer or a transparent conductivity material. In one embodiment, the tunneling layer 11 may be composed of a transparent conductive material, such as the transparent conductive oxide (TCO). The role of the optional tunneling layer is to enhance the tunneling of the carriers at the $p^+/n^+$ tunneling junction formed at the interface between the top cell and the bottom cell. In one embodiment, the tunneling layer 11 may have a thickness ranging from 5 nm to 15 nm, although larger and lesser thicknesses may be also used. The thickness of the tunneling layer is typically adjusted to optimize the tunneling of carriers, as well as the optical coupling between the top cell and the bottom cell.

Figure 5:
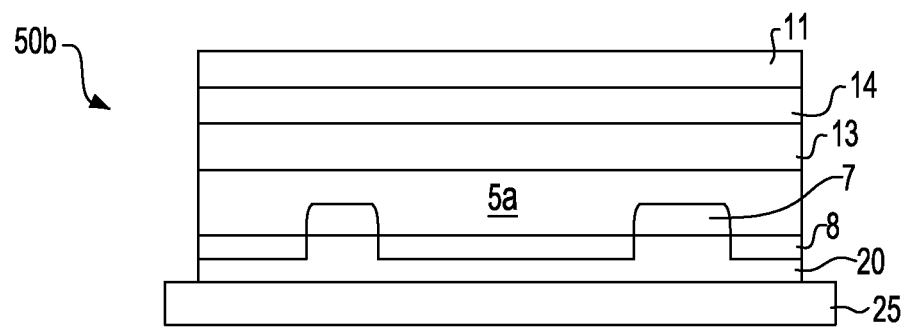

FIG. 5 depicts another embodiment of a bottom solar cell 50b. In the embodiment depicted in FIG. 5, the double emitter structure that is depicted in FIG. 4 is replaced with a single emitter structure identified by reference number 13. The single emitter structure 13 may be provided by a semiconductor layer similar to the first emitter region 6 that is described above with reference to FIG. 4.

Referring to FIG. 5, the handling substrate 25, the stressor layer 20, the passivation layer 8, the localized back surface region 7 and the transferred portion of the germanium containing substrate 5a that is depicted in FIG. 5 are similar to the handling substrate 25, the stressor layer 20, the passivation layer 8, the localized back surface region 7 and the transferred portion of the germanium containing substrate 5a that is depicted in FIG. 4. The single emitter structure 13 that is depicted in FIG. 5 is similar to the first emitter region 6 that is described above with reference to FIG. 4. Therefore, the description of the first emitter region 6 that is depicted in FIG. 4 is suitable to describe the composition and method of making the single emitter structure 13 that is depicted in FIG. 5. Similar to the first emitter region 6 that is depicted in FIG. 4, the single emitter structure 13 may be composed of a doped material layer that is deposited on the transferred portion of the germanium-containing substrate 5a that provides the absorption layer, or may be a counter doped region that is formed into the cleaved surface 4 of the transferred portion of the germanium-containing substrate 5a that provides the absorption layer.

Still referring to FIG. 5, an intrinsic hydrogenated amorphous semiconductor layer 14 may be formed on the upper surface of the single emitter structure 13. The intrinsic hydrogenated amorphous silicon layer 14 may function as a passivation layer. The intrinsic hydrogenated amorphous semiconductor layer 14 may be formed using the method of forming the intrinsic hydrogenated amorphous silicon layer that is described above with reference to FIG. 2. Alternatively, the intrinsic hydrogenated amorphous semiconductor layer 14 may be composed of intrinsic hydrogenated amorphous germanium or intrinsic hydrogenated amorphous silicon germanium. A tunneling layer 11 may be formed on the intrinsic hydrogenated amorphous semiconductor layer 14. The tunneling layer 11 that is depicted in FIG. 5 is similar to the tunneling layer 11 that is described above with reference to FIG. 4.

Figure 6:
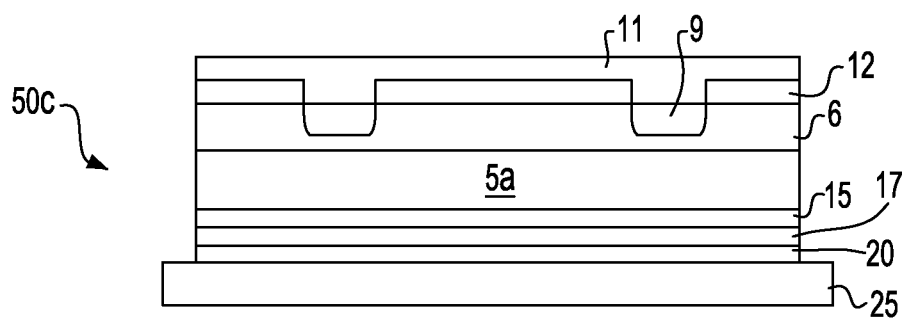

FIG. 6 depicts another embodiment of a bottom solar cell 50c. The embodiment depicted in FIG. 6 is similar to the bottom solar cell 50a that is depicted in FIG. 4, with the exception that the localized back surface field region 7 that is depicted in FIG. 4 is substituted with a back surface field region 15 that extends across the entire width of the transferred portion of the germanium-containing substrate 5a that provides the absorption layer of the bottom solar cell 50c. The back surface field region 15 is similar to the back surface field region that is described above with reference to FIG. 2. In one embodiment, the back surface field region 15 may be a doped region that is implanted into the surface of the transferred portion of the germanium-containing substrate 5a that is opposite the cleaved surface 4 of the transferred portion of the germanium-containing substrate 5a, or the back surface field region 15 may be provided by a deposited layer that is formed on the surface of the transferred portion of the germanium-containing substrate 5a that is opposite the cleaved surface 4 of the transferred portion of the germanium-containing substrate 5a. The back surface field region 15 is doped to the same conductivity type as the transferred portion of the germanium-containing substrate 5a that provides the absorption layer of the bottom solar cell 50c, wherein the dopant concentration in the back surface field region 15 is greater than the dopant concentration in the transferred portion of the germanium-containing substrate 5a.

In one embodiment, an intrinsic hydrogenated amorphous semiconductor layer 17 may be formed in direct contact with the back surface field region 15. The intrinsic hydrogenated amorphous semiconductor 17 may function as a passivation layer. The intrinsic hydrogenated amorphous semiconductor layer 17 may be formed using the method of forming the intrinsic hydrogenated amorphous silicon layer that is described above with reference to FIG. 2. Alternatively, the intrinsic hydrogenated amorphous silicon layer may be composed of hydrogenated amorphous germanium or hydrogenated amorphous silicon germanium.

Although not depicted in FIG. 6, a semiconductor material having the same conductivity type as the transferred portion of the germanium-containing substrate 5a may be present between a stressor layer 20 and the back surface filed region 15. The semiconductor material may be an amorphous material, a nanocrystalline material, microcrystalline material, polycrystalline material, or single crystal material of silicon, germanium, or silicon-germanium alloys that may or may not include hydrogen. This layer may serve to further enhance the electric field at the back surface for repelling the minority carriers. This semiconductor layer is typically chosen to be have a higher doping level than that of the back surface field region 15, and/or a lower electron affinity ($\chi_e$) than the germanium-containing substrate 5 (in case of n-type doping), and/or a larger sum of electron affinity and bandgap ($E_g$), i.e. $\chi_e+E_g$ than the germanium containing substrate 5 (in case of p-type doping). In one example, where the germanium containing substrate is single-crystalline and n-type, the back surface field region 15 is formed by diffusion of phosphorous into the substrate, the passivation layer 17 is intrinsic hydrogenated amorphous silicon deposited by PECVD, and the optional semiconductor layer mentioned above is n$^+$ doped hydrogenated amorphous Si deposited also by PECVD. Since hydrogenated amorphous Si has a lower electron affinity than the substrate 5, the n+ doped hydrogenated amorphous Si layer mentioned above (not shown) improves the electric field that repels the minority carriers (holes) from the back surface. In another example the same as the aforementioned example with the exception that the back-surface-field layer 15 is formed by deposition of n$^+$ doped poly-silicon by a CVD technique, or by deposition of n$^+$ doped amorphous Si by a CVD or PVD technique followed by solid-phase-crystallization (e.g. by rapid thermal annealing at temperatures >600° C.) to form n$^+$ doped poly-Si; since hydrogenated amorphous Si has a lower electron affinity than the substrate 5, and poly-Si layer 15, the n$^+$ doped hydrogenated amorphous Si layer mentioned above (not shown) improves the electric field that repels the minority carriers (holes) from the back surface of the substrate. In another example where the germanium containing substrate is single-crystalline and p-type, the back surface field region 15 is formed by diffusion of aluminum into the substrate, the passivation layer 17 is intrinsic hydrogenated amorphous silicon-germanium deposited by PECVD, and the optional semiconductor layer mentioned above is p$^+$ doped hydrogenated amorphous silicon-germanium deposited also by PECVD. Since hydrogenated amorphous SiGe has a larger sum of electron affinity and bandgap ($\chi_e+E_g$) than the substrate 5, the p$^+$ doped hydrogenated amorphous SiGe layer mentioned above (not shown) improves the electric field that repels the minority carriers (electrons) from the back surface of the germanium containing substrate 5. In another example, the same as the aforementioned embodiment except in that the back-surface-field layer 15 is formed by deposition of p$^+$ doped poly-silicon (or poly-SiGe) by a CVD technique, or by deposition of p$^+$ doped amorphous Si (or amorphous SiGe) by a CVD or PVD technique followed by solid-phase-crystallization to form p$^+$ doped poly-Si (or poly-SiGe); since hydrogenated amorphous Si (or SiGe) has a larger sum of electron affinity and bandgap ($\chi_e+E_g$) than the substrate 5, and poly-Si (or poly- SiGe) layer 15, the p⁺ doped hydrogenated amorphous Si layer mentioned above (not shown) improves the electric field that repels the minority carriers (electrons) from the back surface of the substrate 5. In the embodiment depicted in FIG. 6, the back surface field region 15, the intrinsic hydrogenated amorphous silicon layer 17, and the semiconductor material (not shown) having the same conductivity type as the transferred portion of the germanium-containing substrate 5a are optional, and may be omitted.

The handling substrate 25, the stressor layer 20, the transferred portion 5a of the germanium containing substrate, the first emitter region 6, the second emitter region 9, the upper dielectric layer 12, and the tunneling layer 11 that are depicted in FIG. 6 are similar to handling substrate 25, the stressor layer 20, the transferred portion 5a of the germanium containing substrate, the first emitter region 6, the second emitter region 9, the upper dielectric layer 12, and the tunneling layer 11 that are depicted in FIG. 4. Therefore, the above description of the handling substrate 25, stressor layer 20, the transferred portion 5a of the germanium containing substrate, the first emitter region 6, the second emitter region 9, the upper dielectric layer 12, and the tunneling layer 11 with reference to FIG. 4 is suitable for the structures identified by the same reference numbers in FIG. 6.

Figure 7:
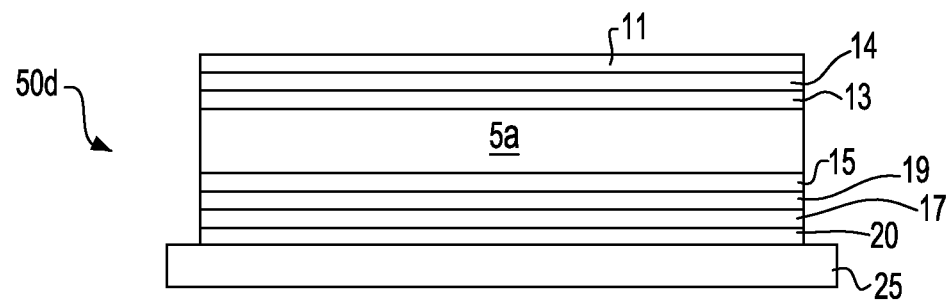
Figure 8:
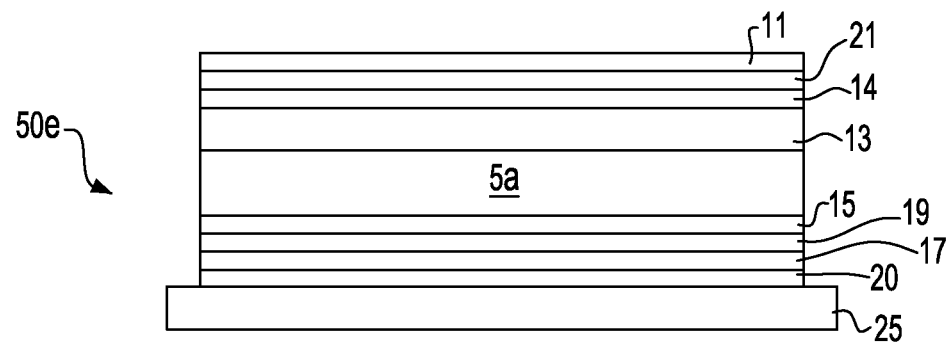

FIG. 7 depicts another embodiment of a bottom solar cell 50d. In the embodiment, depicted in FIG. 7, single emitter structure 13 is in direct contact with a transferred portion 5a of the germanium-containing substrate, a hydrogenated amorphous silicon layer 14 is present on the upper surface of the single emitter structure 13 and a tunneling layer is present on the hydrogenated amorphous silicon layer. The single emitter structure 13, and the hydrogenated amorphous silicon layer 14 have been described above with reference to FIG. 5. The transferred portion of the germanium-containing substrate 5a and the tunneling layer 11 have been described above with reference to FIG. 4. The bottom solar cell 50d that is depicted in FIG. 7 further includes a back surface field region 15 that is in direct contact with, or formed within, the transferred portion of the germanium-containing substrate 5a, and an intrinsic hydrogenated amorphous silicon layer 17 that is in direct contact with the back surface filed region 15. The back surface field region 15 and the intrinsic hydrogenated amorphous silicon layer 17 have been described above with reference to FIG. 6. The bottom solar cell 50d that is depicted in FIG. 7 may further include an intrinsic hydrogenated amorphous silicon layer 17, and a semiconductor material 19 having the same conductivity type as the transferred portion 5a of the germanium-containing substrate. Similar to the back surface field region 15 and the intrinsic hydrogenated amorphous silicon layer 17, the stressor layer 20 and the semiconductor material 19 have been described above with reference to FIG. 6. The bottom solar cell 50e that is depicted in FIG. 8 is similar to the bottom solar cell 50d that is depicted in FIG. 7 with the exception that the bottom solar cell 50e that is depicted in FIG. 8 further includes a semiconductor material 19 having the same conductivity type as the single emitter structure 13. The semiconductor material 19 may be an amorphous material, a nanocrystalline material, microcrystalline material, polycrystalline material, or single crystal material of silicon, germanium, or silicon-germanium alloys that may or may not include hydrogen.

In each of the embodiments that are depicted in FIGS. 4-8, the transferred portion 5a of the germanium containing substrate may be chosen to have a thickness that allows for the bottom solar cell 50a, 50b, 50c, 50d, 50e to be flexible. By "flexible" it is meant that the bottom solar cell 50a, 50b, 50c, 50d, 50e including the germanium-containing substrate 5 remains operational under and inward or outward curvature of radius of at least 30 cm. The bottom solar cells 50a, 50b, 50c, 50d, 50e that are depicted in FIGS. 4-8 may be employed in any type multi-junction photovoltaic device.

Figure 9:
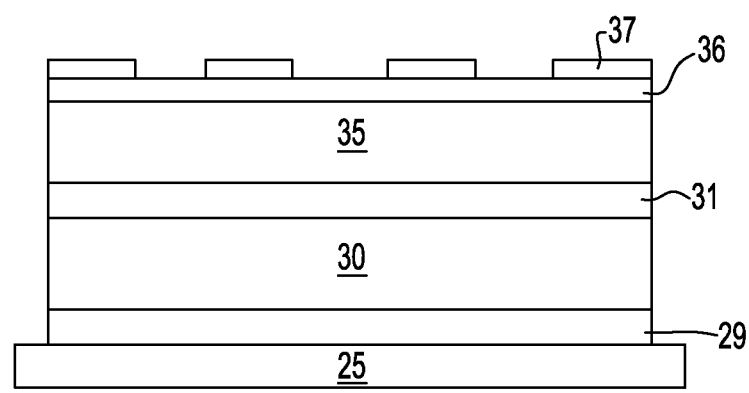
FIG. 9 is a side cross-sectional view depicting forming a second solar cell on the first solar cell, wherein the second solar cell is composed of at least one semiconductor material having a band gap to absorb a range of wavelengths that is different than the range of wavelengths absorbed by the first solar sell, in accordance with one embodiment of the present disclosure.

FIG. 9 depicts forming at least a second solar cell 35 on a first solar cell 30, wherein the at least one second solar cell 35 is composed of at least one semiconductor material having a wider band gap than that of the first solar cell 30. In a typical semiconductor, the majority of incident protons having energies smaller than the bandgap of the semiconductor are not absorbed in the semiconductor. In contrast, a portion of photons with energies larger than that of the bandgap of the semiconductor may be absorbed and converted to electron-hole pairs. The portion of the photon energy consumed for the electron-hole generation is proximate to the bandgap energy of the semiconductor, while the excess photon energy (approximately equal to the difference between the photon energy and bandgap energy) is dissipated as heat. Therefore, the conversion of light into electricity is typically most efficient for photons having energies close to that of the bandgap energy. The combination of a wide bandgap top cell 35 and a narrow band gap bottom cell 30 may allow for a more efficient conversion of photons with higher energies in the top cell 35 (which would otherwise be less efficiently converted in the bottom cell 30 due to a high thermal loss) and a more efficient conversion of photons with lower energies (the majority of which absorbed in the top cell 35) in the bottom cell 30.

The first solar cell 30 may absorb a first range of wavelengths, and the second solar cell 35 may absorb a second range a wavelengths, wherein they may be a small overlap between the first and second range of wavelengths.

In one example, the materials of at least the second solar cell 35 are selected to have a bandgap ranging from 0.7 eV to 4.5 eV, and the materials of the first solar cell 30 are selected to have a bandgap ranging from 0.1 eV to 2.0 eV. In another example, the materials of at least the second solar cell 35 are selected to have a bandgap ranging from 1.5 eV to 3.0 eV, and the materials of the first solar cell 30 are selected to have a bandgap in the range of 0.6 eV to 1.8 eV. The energy of a photon (hv) and the wavelength of a photon ($\lambda$) are related through the well-known relation hv=hc/$\lambda$, where h is the Plank's constant, and c is the speed of light (the value of hc is approximately equal to 1239 eV/nm). For example, the energy of a photon of a wavelength of 450 nm is approximately 2.8 eV.

Referring to FIG. 9, the bottom cell, i.e., first solar cell 30, may be single-crystalline, microcrystalline or polycrystalline. In one embodiment, single-crystalline Ge (c-Ge) is the material employed in the first solar cell 30, however, other low bandgap materials such as InSb, InAs, InGaAs, InGaSb and InN, as well as materials with higher bandgaps such as Si or GaAs are also within the scopes of this disclosure. The first solar cell 30 may have homojunction, heterojunction or hybrid (combination of homojunction and heterojunction) contacts. It is noted that any of the bottom cell structures 50a, 50b, 50c, 50d, 50e that are depicted in FIGS. 4-8 may be employed as the first solar cell 30 that is depicted in FIG. 9. A transparent conductive material layer 29, such as a transparent conductive oxide (TCO), may be present underlying the first solar cell 30, wherein the transparent conductive material layer 29 is present between the first solar cell 30 and the handling substrate 25. In some embodiments, the transparent conductive material layer 29 may be substituted with a stressor layer, or the transparent conductive material layer 29 may be employed in combination with a stressor layer. The handling substrate 25 that is depicted in FIG. 9 has been described above with reference to FIGS. 1-8.

The first solar cell 30 may be separated from the second solar cell 35 by a tunneling layer 29. The tunneling layer 31 that is depicted in FIG. 9 may be provided by the tunneling layer 11 that is depicted in FIGS. 4-8.

The at least one second solar cell 35, i.e., top cell, that is depicted in FIG. 9 may be composed of single-crystalline, microcrystalline, polycrystalline or amorphous semiconductor materials. It is noted that the at least one second solar cell 35 may be composed of any number of p-n (or p-i-n) junctions, and therefore may be any number of solar cells. In one embodiment, the at least one second solar cell 35 may be composed of silicon-containing and/or germanium-containing semiconductor material, or the second solar cell 35 may be composed of compound semiconductor materials.

Examples of silicon-containing semiconductor materials that are suitable for the second solar cell 35 include single crystal silicon, polycrystalline silicon, silicon alloyed with carbon, amorphous silicon, amorphous hydrogenated silicon, amorphous hydrogenated silicon alloyed with carbon, and combination thereof. Examples of germanium-containing semiconductor materials include single crystal germanium, polycrystalline germanium, amorphous germanium, amorphous hydrogenated germanium, amorphous hydrogenated germanium which may contain carbon. In some examples, the second solar cell 35 may be composed of material layers that include both germanium and silicon, such as single crystal silicon germanium, polycrystalline silicon germanium, amorphous silicon germanium, hydrogenated amorphous silicon germanium and hydrogenated amorphous silicon germanium which may contain carbon. Examples of compound semiconductor materials that are suitable for the second solar cell 35 include aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), or combinations thereof.

Referring to FIG. 9, a transparent conductive material layer 36 may be present on the upper surface of the second solar cell 35. The transparent conductive material layer 36 can include a transparent conductive oxide (TCO) such as, but not limited to, a fluorine-doped tin oxide ($SnO_2$:F), an aluminum-doped zinc oxide (ZnO:Al), tin oxide (SnO) and indium tin oxide ($InSnO_2$, or ITO for short). The thickness of the transparent conductive material layer 36 may vary depending on the type of transparent conductive material employed, as well as the technique that was used in forming the transparent conductive material. Typically, and in one embodiment, the thickness of the transparent conductive material layer 36 ranges from 10 nm to 3 microns.

At least one front contact 37 may be atop the transparent conductive oxide (TCO). The front contact 50 of the photovoltaic device may include a set of parallel narrow finger lines and wide 37 lines deposited essentially at a right angle to the finger lines. The front contact 37 may be deposited with a screen printing technique or photolithography or some other techniques. In another embodiment, the front contact 37 is provided by the application of an etched or electroformed metal pattern. The metallic material used in forming the metal pattern for the front contact 37 may also be deposited using sputtering or plating. The thickness of the front contact 37 can range from 100 nm to 10 μm, although lesser and greater thicknesses can also be employed. In some embodiments, forming the front contact 50 may include applying an antireflection (ARC) coating. The antireflection coating (ARC) may be composed of silicon nitride ($SiN_x$) or silicon oxide ($SiO_x$) grown by PECVD at temperatures as low as 200° C. In another example, the antireflective coating (ARC) may be a dual layer structure composed of zinc-sulfide (ZnS) and magnesium fluoride ($MgF_2$). Other embodiments have been contemplated that do not include the above compositions for the antireflection coating (ARC) and the front contact 37.

The photovoltaic device that is depicted in FIG. 9 is provided for illustrative purposes only and is not intended to limit the present disclosure. It is noted that any number of solar cells and contact structures may be present atop the first solar cell 30 that is depicted in FIG. 9.

Figure 10:
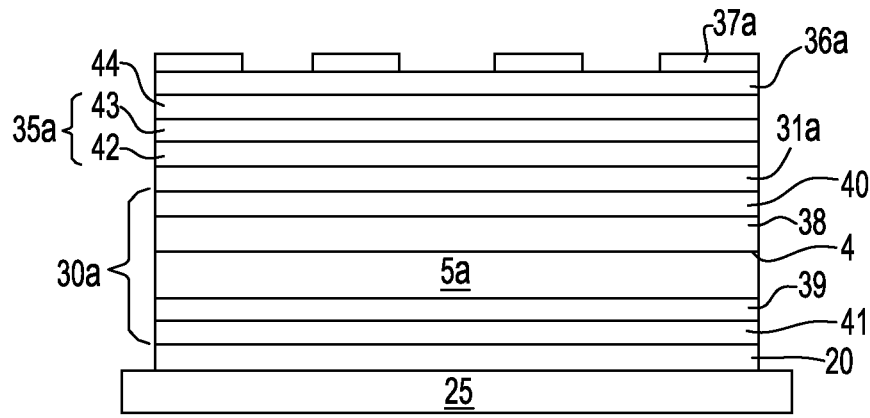
FIG. 10 is a side cross-sectional view of one embodiment of a photovoltaic device that is formed in accordance with the present disclosure, wherein the first solar cell includes a crystalline germanium layer and a semiconductor layer that is formed on a cleaved surface of the crystalline germanium layer, wherein a second solar cell is present on the first solar cell and includes a p-i-n junction that is composed of hydrogenated amorphous silicon.

FIG. 10 depicts one embodiment of a tandem photovoltaic device in which the first solar cell 30a includes a transferred portion of the germanium-containing substrate 5a, e.g., a crystalline germanium layer, and a semiconductor layer that is formed on a cleaved surface 4 of the transferred portion 5a of the germanium-containing substrate. The photovoltaic device that is depicted in FIG. 10 is a tandem device comprised of first solar cell 30a of a heterojunction (HJ) single crystal germanium cell and at least a second solar cell 35a composed of p-type conductivity hydrogenated amorphous silicon, intrinsic hydrogenated amorphous silicon, and n-type conductivity hydrogenated amorphous silicon.

In one embodiment, the transferred portion 5a of the germanium-containing substrate is composed of single crystal germanium that is doped to a n-type conductivity. An intrinsic semiconductor layer 38, 39 may be present on the upper and lower surface of the transferred portion 5a of the germanium-containing substrate. The intrinsic semiconductor layer 38, 39 may be composed of hydrogenated amorphous silicon. In one embodiment, an upper p-type conductivity hydrogenated amorphous silicon layer 40 may be present on the intrinsic semiconductor layer 38 that is presented on the cleaved surface 4 of the transferred portion of the germanium-containing substrate 5a that is doped to an n-type conductivity. A lower n-type conductivity hydrogenated silicon layer 41 is typically underlying the intrinsic semiconductor layer 39 that is present on the back surface of the transferred portion of the germanium-containing substrate 5a. The lower n-type conductivity hydrogenated silicon layer 41 may be present on an upper surface of a stressor layer 20 composed of a metal. A handling substrate 25, which may be flexible, is present under the stressor layer 20.

Still referring to FIG. 10, the first solar cell 30a is separated from at least a second solar cell 35a by a tunneling layer 31a. The tunneling layer 31a that is depicted in FIG. 10 is similar to the tunneling layer 31 that is depicted in FIG. 9. Therefore, the description of the tunneling layer 31 that is depicted in FIG. 9 is suitable for the tunneling layer 31a that is depicted in FIG. 10. The at least one second solar cell 35a may include a p-i-n junction that is provided by a material stack that includes, from top to bottom, a p-type hydrogenated amorphous silicon layer 44, intrinsic amorphous silicon layer 43, and an n-type hydrogenated amorphous silicon layer 42. A transparent conductive material layer 36a may be present on the upper surface of the at least one second solar cell 35a. A front contact 37a may be present on the transparent conductive material layer 36a. The transparent conductive material layer 36a and the front contact 37a that are depicted in FIG. 10 are similar to the transparent conductive material layer 36 and the front contact 37 that are depicted in FIG. 9.

In one embodiment, to form the structure depicted in FIG. 9, the intrinsic semiconductor layer 39 of hydrogenated amorphous silicon and the lower n-type conductivity hydrogenated amorphous silicon layer 41 may be formed on a germanium containing substrate prior to spalling. The stressor layer 20 may then be deposited on the n-type conductivity hydrogenated amorphous silicon layer, wherein stress from the stressor layer 41 induces spalling of the germanium containing substrate. The transferred portion 5a of the germanium containing substrate remains attached to the intrinsic semiconductor layer 39, wherein the transferred portion 5a of the germanium containing substrate has a thickness ranging from 500 nm to 10 microns, although thinner or thicker layers may be transferred as well. Following spalling, the intrinsic semiconductor layer 38 is formed on the cleaved surface 4 of the transferred portion of the germanium containing substrate 5a, and the upper p-type conductivity hydrogenated amorphous silicon layer 40 is formed on the intrinsic semiconductor layer 38. The tunneling layer 31a, the at least one second solar cell 35a, the transparent conductive material layer 36a, and the front contact 37a may then be formed.

Figure 11:
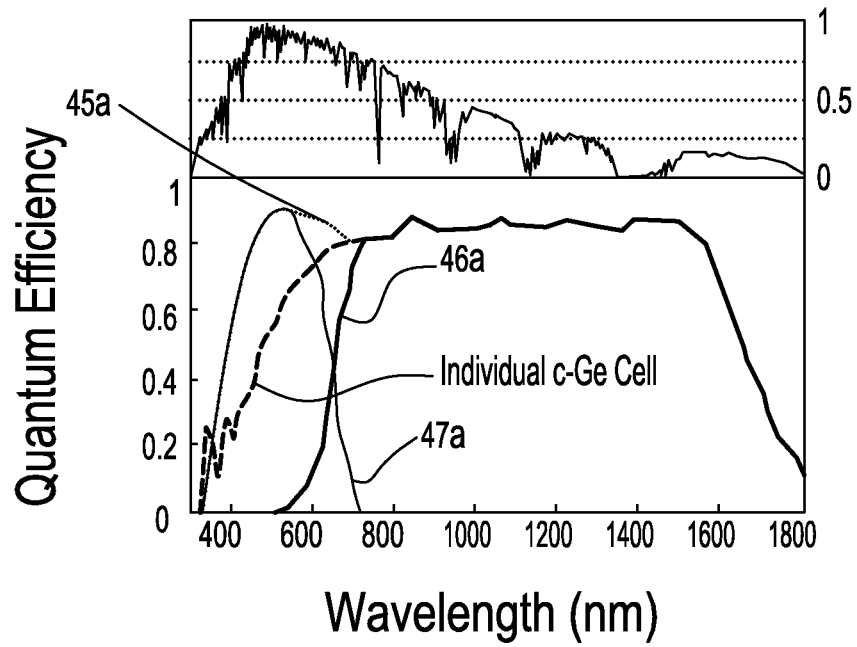
FIG. 11 is a plot of the quantum efficiency as a function of wavelength (nm) for the photovoltaic device depicted in FIG. 10, in accordance with one embodiment of the present disclosure.
Figure 12:
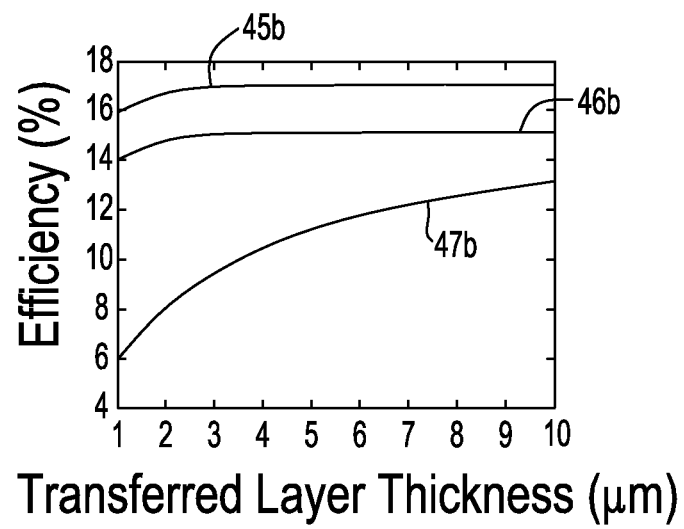
FIG. 12 is a plot of the quantum efficiency as a function of transferred layer thickness (nm) for the photovoltaic device depicted in FIG. 10, in accordance with one embodiment of the present disclosure.

The calculated quantum efficiency of the tandem photovoltaic device that is depicted in FIG. 10 based on the quantum efficiencies of the first and at least the second solar cells 30a, 35a is plotted in FIG. 11, as identified by reference number 45a, and the predicted efficiency of the tandem photovoltaic device that is depicted in FIG. 10 as a function of the thickness of the transferred portion 5a of the crystalline germanium substrate is plotted in FIG. 12, as identified by reference number 45b. Comparative examples are provide in FIGS. 11 and 12 by plots of the efficiencies of a homo-junction single crystalline germanium bottom cell identified by reference number 46a, 46b, identified by reference numbers 46a, 46b, and a hetero-junction single crystal silicon cell with contacts of amorphous hydrogenated silicon, identified by reference numbers 47a, 47b. Referring to FIGS. 11 and 12, the higher efficiency in the case of the tandem photovoltaic device including the transferred portion 5a of the germanium containing substrate (single crystal germanium) compared to a similarly prepared device having a bottom cell composed of silicon is due to the lower bandgap and smaller spectral overlap of single crystal germanium with the adjacent material layers of hydrogenated amorphous silicon, as employed in the tandem photovoltaic device that is depicted in FIG. 10.

Figure 13:
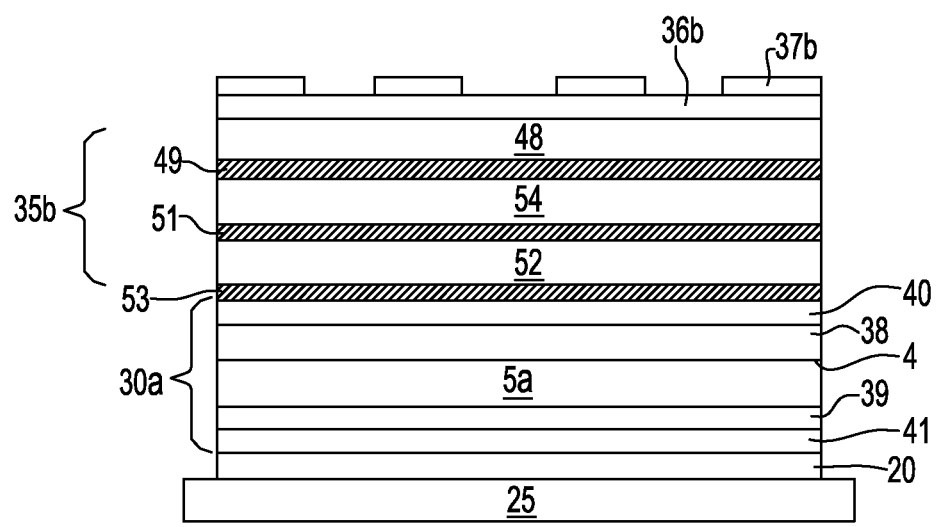
FIG. 13 is a side cross-sectional view of a one embodiment of a photovoltaic device that is formed in accordance with the present disclosure, wherein the first solar cell includes a crystalline germanium layer and a semiconductor layer that is formed on a cleaved surface of the crystalline germanium layer, wherein a second solar cell is present on the first solar cell and includes three p-i-n junctions.

FIG. 13 depicts another embodiment of a tandem photovoltaic device that includes a second solar cell 35b that is composed of a triple junction. The first solar cell 30b of the tandem photovoltaic device that is depicted in FIG. 13 is similar to the first solar cell 30a that is depicted in FIG. 10. Therefore, the description of the first solar cell 30a, and the material layers included therein, that are depicted in FIG. 10 is suitable for the first solar cell 30b, and the materials included therein, that are depicted in FIG. 13. Similarly, the description of the stressor layer 20 and the handling substrate 25, which may be flexible, that are depicted in FIG. 10 are suitable for the stressor layer 20 and the handling substrate 25 that are depicted in FIG. 13.

In one embodiment, the second solar cell 35 is composed of a material stack that includes, from top to bottom, a first p-i-n junction 48, a first tunneling layer 49, a second p-i-n junction 54, a second tunneling layer 52 and a third p-i-n junction 53. In one embodiment, the first p-i-n junction 48 is composed of a p-type conductivity hydrogenated amorphous silicon layer, an intrinsic hydrogenated amorphous silicon layer, and an n-type conductivity hydrogenated amorphous silicon layer. In one embodiment, the second p-i-n junction 54 is composed of a p-type conductivity hydrogenated amorphous silicon germanium layer, an intrinsic hydrogenated amorphous silicon germanium layer, and an n-type conductivity hydrogenated amorphous silicon germanium layer. In one embodiment, the third p-i-n junction 52 is composed of a p-type conductivity hydrogenated crystalline silicon layer, an intrinsic hydrogenated crystalline silicon layer, and an n-type conductivity hydrogenated crystalline silicon layer.

In one embodiment, to form the structure depicted in FIG. 13, the intrinsic semiconductor layer 39 of hydrogenated amorphous silicon and the lower n-type conductivity hydrogenated amorphous silicon layer 41 may be formed on a germanium containing substrate prior to spalling. The stressor layer 20 may then be deposited on the n-type conductivity hydrogenated amorphous silicon layer 41, wherein stress from the stressor layer 20 induces spalling of the germanium containing substrate. The transferred portion 5a of the germanium containing substrate remains attached to the intrinsic semiconductor layer 39, wherein the transferred portion 5a of the germanium containing substrate has a thickness ranging from 500 nm to 10 microns, although thinner or thicker layers may be also transferred. Following spalling, the intrinsic semiconductor layer 38 is formed on the cleaved surface 4 of the transferred portion 5a of the germanium containing substrate, and the upper p-type conductivity hydrogenated amorphous silicon layer 40 is formed on the intrinsic semiconductor layer 38. The at least one second cell 35b, the transparent conductive material layer 36b, and the front contact 37b may then be formed.

Figure 14:
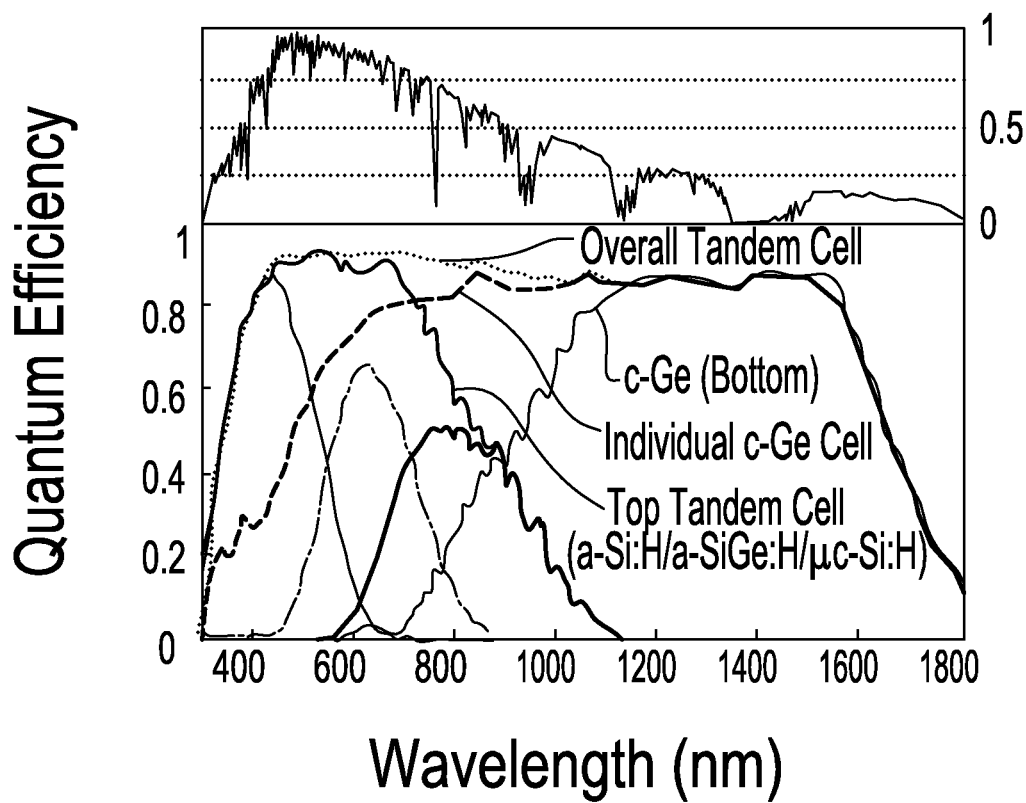
FIG. 14 is a plot of the quantum efficiency as a function of wavelength (nm) for the photovoltaic device depicted in FIG. 13, in accordance with one embodiment of the present disclosure.
Figure 15:
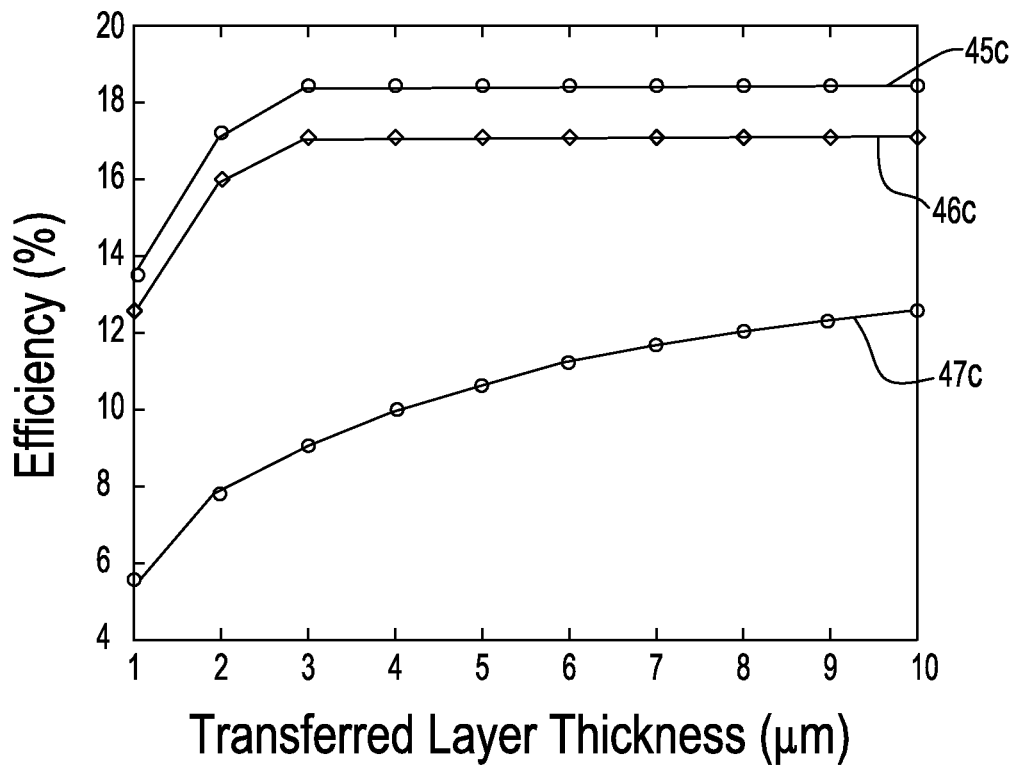
FIG. 15 is a plot of the quantum efficiency as a function of transferred layer thickness (nm) for the photovoltaic device depicted in FIG. 13, in accordance with one embodiment of the present disclosure.

The calculated quantum efficiency of the tandem photovoltaic device depicted in FIG. 13 based on the quantum efficiencies of the top and bottom cells 30b, 35b is plotted in FIG. 14, and the predicted efficiency of the tandem photovoltaic device as a function of the thickness of the transferred portion of the germanium 5a containing substrate is plotted in FIG. 15, as identified by reference number 45c. Comparative examples are provide in FIGS. 14 and 15 by plots of the efficiencies of a homo-junction single crystalline germanium bottom cell identified by reference number 46a, 46b, identified by reference numbers 46a, 46b, and a hetero-junction single crystal silicon cell with contacts of amorphous hydrogenated silicon, identified by reference numbers 47a, 47b. Referring to FIGS. 14 and 15, the higher efficiency in the case of the tandem photovoltaic device depicted in FIG. 13 including the transferred portion of the germanium containing substrate 5a (single crystal germanium) compared to a similarly prepared device having a bottom cell composed of silicon is due to the lower bandgap and smaller spectral overlap of single crystal germanium with the adjacent material layers of hydrogenated amorphous silicon, as employed in the tandem photovoltaic device that is depicted in FIG. 13.

Figure 16:
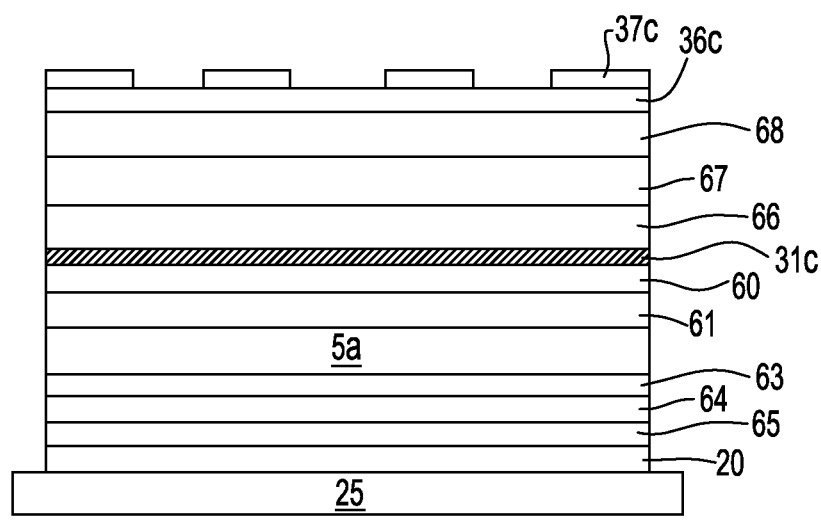
FIG. 16 is a side cross sectional view of one embodiment of a photovoltaic device that is formed in accordance with the present disclosure, wherein the first solar cell includes a crystalline germanium layer and a semiconductor layer that is formed on a cleaved surface of the crystalline germanium layer, wherein a second solar cell is present on the first solar cell and includes a p-type buffer region on the first solar cell, a layer of copper-indium-gallium sellenide (CIGS), $Cu_2ZnSnS_4$ (CZTS), $Cu_2ZnSnSe_4$ (CZTSe) or cadmium telluride on the p-type buffer region, and an n-type cadmium sulfide.

FIG. 16 depicts another embodiment of a tandem photovoltaic device, wherein the first solar cell 30c includes p-type conductivity crystalline germanium layer, which may be provided from a transferred portion of a germanium containing substrate 5a, and at least one semiconductor layer that is formed on a cleaved surface of the transferred portion of a germanium containing substrate 5a. In one embodiment, the at least one semiconductor layer is composed of an upper intrinsic hydrogenated amorphous silicon layer 61 that is present on the cleaved surface of the transferred portion of the germanium containing substrate 5a. An n-type conductivity hydrogenated amorphous silicon layer 61 is then formed on the intrinsic hydrogenated amorphous silicon layer 61. An epitaxial silicon layer 63 may be formed on the back surface of the transferred portion of the germanium containing substrate 5a that is opposite the cleaved surface 4 of the transferred portion of germanium containing substrate 5a. The epitaxial silicon layer 63 typically has the same conductivity type as the transferred portion of the germanium containing substrate 5a. Therefore, if the transferred portion of the germanium containing substrate 5a has a p-type conductivity, the epitaxial silicon layer 63 has a p-type conductivity. The dopant concentration of the epitaxial silicon layer 63 is typically greater than the dopant concentration in the transferred portion of germanium containing substrate 5a. A lower intrinsic hydrogenated amorphous silicon layer 63 may be in contact with the epitaxial silicon layer 63, and a p-type conductivity hydrogenated amorphous silicon layer 65 may be underlying the epitaxial silicon layer 63. The description of the stressor layer 20 and the handling substrate 25, which may be flexible, that are depicted in FIG. 10 are suitable for the stressor layer 20 and the handling substrate 25 that are depicted in FIG. 16.

Still referring to FIG. 16, the first solar cell 30c is separated from at least a second solar cell 35c by a tunneling layer 31c. The tunneling layer 31c that is depicted in FIG. 16 is similar to the tunneling layer 31 that is depicted in FIG. 9. The at least one second solar cell 35c may include a p-type buffer region 66 on the tunneling layer 31c, a layer of p-type copper-indium-gallium sellenide, p-type cadmium telluride, p-type CZTS or p-type CZTSe on the p-type buffer region 67, and an n-type cadmium sulfide layer 68. A transparent conductive material layer 36c may be present on the upper surface of the at least one second solar cell 35c. A front contact 37c may be present on the transparent conductive material layer 36c.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising:
    a back contact structure on an upper surface of a flexible substrate;
    a first solar cell present on the back contact structure, wherein the first solar cell includes a germanium-containing crystalline semiconductor layer having a thickness ranging from 100 nm to 100 μm, wherein the first solar cell absorbs a first range of wavelengths;
    at least a second solar cell present on the first solar cell, the at least one second solar cell is composed of at least one semiconductor material that is selected so that the second solar cell absorbs a second range of wavelengths that is different than the first range of wavelengths absorbed by the first solar cell; and
    a front contact structure on the upper surface of the at least one second solar cell, wherein a passivation layer, a back surface field region or a combination of a passivation layer and a back surface field region is located between the germanium containing crystalline semiconductor layer and the back contact structure that is present on the upper surface of the flexible substrate.

2. The photovoltaic device of claim 1, wherein the germanium-containing crystalline semiconductor layer of said first solar cell has a first conductivity type, and the first solar cell further comprises an upper semiconductor layer having a second conductivity type that is opposite the first conductivity type that is in direct contact with the germanium-containing crystalline semiconductor layer.

3. The photovoltaic device of claim 1, wherein the germanium-containing crystalline semiconductor layer of said first solar cell has a first conductivity type, and the first solar cell further comprises an intrinsic semiconductor layer that is in direct contact with the germanium containing crystalline semiconductor layer, and an upper semiconductor layer having a second conductivity type that is opposite the first conductivity type that is in direct contact with the intrinsic semiconductor layer.

4. The photovoltaic device of claim 1, wherein the at least one second solar cell present on the first solar cell comprises a p-i-n junction of hydrogenated amorphous silicon, hydrogenated amorphous silicon carbide, hydrogenated amorphous silicon-germanium, hydrogenated crystalline silicon, or a combination thereof.

5. The photovoltaic device of claim 1, wherein the at least one second solar cell present on the first solar cell comprises a first p-i-n junction of hydrogenated amorphous silicon germanium present on the first solar cell, and a second p-i-n junction of hydrogenated amorphous silicon which may contain carbon present on the first solar cell.

6. The photovoltaic device of claim 1, wherein the at least one second solar cell present on the first solar cell comprises a first p-i-n junction of hydrogenated crystalline silicon on the first solar cell, a second p-i-n junction of hydrogenated amorphous silicon germanium present on the first solar cell, and a third p-i-n junction of hydrogenated amorphous silicon comprising carbon present on the second solar cell.

7. The photovoltaic device of claim 1, wherein the at least one second solar cell present on the first solar cell comprises a first p-i-n junction of hydrogenated amorphous silicon germanium present on the first solar cell, a second p-i-n junction of hydrogenated amorphous silicon comprising carbon present on the first solar cell, and a third junction of hydrogenated amorphous silicon-carbide on the second solar cell.

8. The photovoltaic device of claim 1, wherein the at least one second solar cell present on the first solar cell comprises a first p-i-n junction of hydrogenated nano/microcrystalline silicon present on the first solar cell, a second p-i-n junction of hydrogenated amorphous silicon comprising carbon present on the first solar cell, and a third junction of hydrogenated amorphous silicon-carbide on the second solar cell.

9. The photovoltaic device of claim 1, wherein the at least one second solar cell comprises a p-type buffer region on the first solar cell, a layer of copper-indium-gallium sellenide, cadmium telluride, CZTS (copper, zinc, tin, and sulfur) or CZTSe (copper, zinc, tin, selenium) on the p-type buffer region, and an n-type cadmium sulfide.

10. A photovoltaic device comprising:
    a back contact structure on an upper surface of a flexible substrate;
    a first solar cell present on the back contact structure, wherein the first solar cell includes a germanium-containing crystalline semiconductor layer having a thickness ranging from 100 nm to 100 μm, wherein the first solar cell absorbs a first range of wavelengths;
    at least a second solar cell present on the first solar cell, the at least one second solar cell is composed of at least one semiconductor material that is selected so that the second solar cell absorbs a second range of wavelengths that is different than the first range of wavelengths absorbed by the first solar cell; and a front contact structure on the upper surface of the at least one second solar cell, wherein the germanium-containing crystalline semiconductor layer of said first solar cell has a first conductivity type, and the first solar cell further comprises an intrinsic semiconductor layer that is in direct contact with the germanium containing crystalline semiconductor layer, and an upper semiconductor layer having a second conductivity type that is opposite the first conductivity type that is in direct contact with the intrinsic semiconductor layer.

11. The photovoltaic device of claim 10 further comprising a passivation layer, a back surface field region or a combination of a passivation layer and a back surface field region located between the germanium containing crystalline semiconductor layer and the back contact structure that is present on the upper surface of the flexible substrate.

12. A photovoltaic device comprising:
a back contact structure on an upper surface of a flexible substrate;
a first solar cell present on the back contact structure, wherein the first solar cell includes a germanium-containing crystalline semiconductor layer having a thickness ranging from 100 nm to 100 µm, wherein the first solar cell absorbs a first range of wavelengths;
at least a second solar cell present on the first solar cell, the at least one second solar cell may be composed of at least one semiconductor material that is selected so that the second solar cell absorbs a second range of wavelengths that is different than the first range of wavelengths absorbed by the first solar cell; and
a front contact structure on the upper surface of the at least one second solar cell, wherein said at least one second solar cell present on the first solar cell is selected from the group consisting of:
(a) a p-i-n junction of hydrogenated amorphous silicon, hydrogenated amorphous silicon carbide, hydrogenated amorphous silicon-germanium, hydrogenated crystalline silicon, or a combination thereof;
(b) a first p-i-n junction of hydrogenated amorphous silicon germanium present on the first solar cell, and a second p-i-n junction of hydrogenated amorphous silicon which may contain carbon present on the first solar cell;
(c) a first p-i-n junction of hydrogenated crystalline silicon on the first solar cell, a second p-i-n junction of hydrogenated amorphous silicon germanium present on the first solar cell, and a third p-i-n junction of hydrogenated amorphous silicon comprising carbon present on the second solar cell;
(d) a first p-i-n junction of hydrogenated amorphous silicon germanium present on the first solar cell, a second p-i-n junction of hydrogenated amorphous silicon comprising carbon present on the first solar cell, and a third junction of hydrogenated amorphous silicon-carbide on the second solar cell;
(e) a first p-i-n junction of hydrogenated nano/microcrystalline silicon present on the first solar cell, a second p-i-n junction of hydrogenated amorphous silicon comprising carbon present on the first solar cell, and a third junction of hydrogenated amorphous silicon-carbide on the second solar cell; and
(f) a p-type buffer region on the first solar cell, a layer of copper-indium-gallium sellenide, cadmium telluride, CZTS (copper, zinc, tin, and sulfur) or CZTSe (copper, zinc, tin, selenium) on the p-type buffer region, and an n-type cadmium sulfide.

* * * * *